United States Patent [19]

Dale

[11] Patent Number: 4,916,570
[45] Date of Patent: Apr. 10, 1990

[54] VOLTAGE COMPARATOR CIRCUIT FOR MONITORING A PROCESS OUTPUT VOLTAGE WITHIN A PRESET RANGE

[75] Inventor: James L. Dale, Boise, Id.

[73] Assignee: Micron Technology, Inc., Boise, Id.

[21] Appl. No.: 350,753

[22] Filed: May 11, 1989

[51] Int. Cl.⁴ .............................................. H02H 3/00
[52] U.S. Cl. ....................................... 361/86; 361/90; 340/661; 307/130; 324/99 R
[58] Field of Search ........................ 361/86, 90, 91, 92; 307/130; 340/660, 661, 662; 324/98, 99, 99 D

[56] References Cited

U.S. PATENT DOCUMENTS 3,931,547  1/1976  Glogolja ................................ 361/86
4,835,652  5/1989  Billings et al. ...................... 361/86 X Primary Examiner—Derek S. Jennings
Attorney, Agent, or Firm—Angus C. Fox, III; Stan Protigal; Jon Busack

[57] ABSTRACT

A fluctuating voltage to be monitored is fed to the non-inverting input of a first op amp via a first input resistor; a reference voltage is fed to the inverting input of the second op amp via a second input resistor. The inverting input of the first op amp is taken from a first voltage divider connected between the reference voltage and ground; the non-inverting input of the second op amp is taken from a second voltage divider connected between the fluctuating voltage and ground. The power inputs of both op amps are connected to a positive voltage and ground. The output of both op amps is tied together, with a first feedback loop feeding the tied output voltage to the non-inverting input of the first op amp via a first high-resistance gain-setting resistor, and a second feedback loop feeding the tied output voltage to the inverting input of the second op amp via a second high-resistance gain-setting resistor. The range of acceptable values for the fluctuating voltage is established by selecting appropriate resistances for the resistors which comprise the pair of voltage dividers.

7 Claims, 1 Drawing Sheet

VOLTAGE COMPARATOR CIRCUIT FOR MONITORING A PROCESS OUTPUT VOLTAGE WITHIN A PRESET RANGE

FIELD OF THE INVENTION

The present invention relates to voltage comparator circuits, and more specifically, to those designed to monitor a particular voltage and to provide a signal when that voltage drifts outside an acceptable range for more than a present period of time.

BACKGROUND OF THE INVENTION

Manufacturing processes are generally sensitive to variations in process parameters. This is especially true in the semiconductor manufacturing industry. For example, during the fabrication process for integrated circuits on silicon substrates, gas flow for diffusion, dry etch and implant processes must be maintained within a narrow range by a mass flow controller; the output from a radio frequency generator used to excite gasses during dry etch, chemical vapor deposition (CVD) and sputter processes must be precisely monitored; and the pressure of gasses used for diffusion, dry etch and CVD processes must be kept within optimum parameters if commercially-viable wafers yields are to be obtained.

Unfortunately, myriad factors such as heat, aging and failure of components and power surges intervene to disrupt the stability of physical processes. To prevent a process parameter from deviating from an acceptable range, it is essential that an operator be informed when an unacceptable deviation occurs so that the parameter may be adjusted or the process terminated until the parameter can, once again, be brought within the acceptable range.

Heretofore, monitoring of a process output signals generally required the use of complicated analog to digital circuits which could be interfaced to a control computer. It would be highly desirable to have a relatively simple, easily adjustable circuit for monitoring an output representative of a critical process parameter that would provide a signal whenever the output departed from a present range.

SUMMARY OF THE INVENTION

The circuit, which is the subject of the present invention, is especially suited for monitoring a fluctuating output voltage representative of a process parameter and providing a signal whenever the output voltage deviates from a preset range.

The circuit utilizes a pair of operational amplifiers and a pair of voltage dividers. The fluctuating process parameter output voltage is fed to the non-inverting input of one of the op amps (hereinafter the first op amp) via a first input resistor; a stable reference voltage, corresponding to the ideal process parameter voltage, is fed to the inverting input of the other op amp (hereinafter the second op amp) via a second input resistor. The inverting input of the first op amp is taken from a first voltage divider connected between the reference voltage and ground; the non-inverting input of the second op amp is taken from a second voltage divider connected between the fluctuating voltage and ground. The output of both op amps is tied together, with a first feedback loop feeding the tied output voltage to the non-inverting input of the first op am via a first high-resistance gain-setting resistor, and a second feedback loop feeding the tied output voltage to the inverting input of the second op amp via a second high-resistance gain-setting resistor. The range of acceptable values for the fluctuating process parameter output voltage is established by selecting appropriate resistances for the resistors which comprise the pair of voltage dividers.

As long as the process parameter output voltage remains within the preset range, the tied output from the pair of op amps will remain high. However, when the process parameter output voltage drifts outside the preset range, the tied output will go low. The low voltage signal can be employed to trigger an alram or a switch that will shut down the process until process parameter corrections are implemented.

PREFERRED EMBODIMENT OF THE INVENTION

Figure 1:
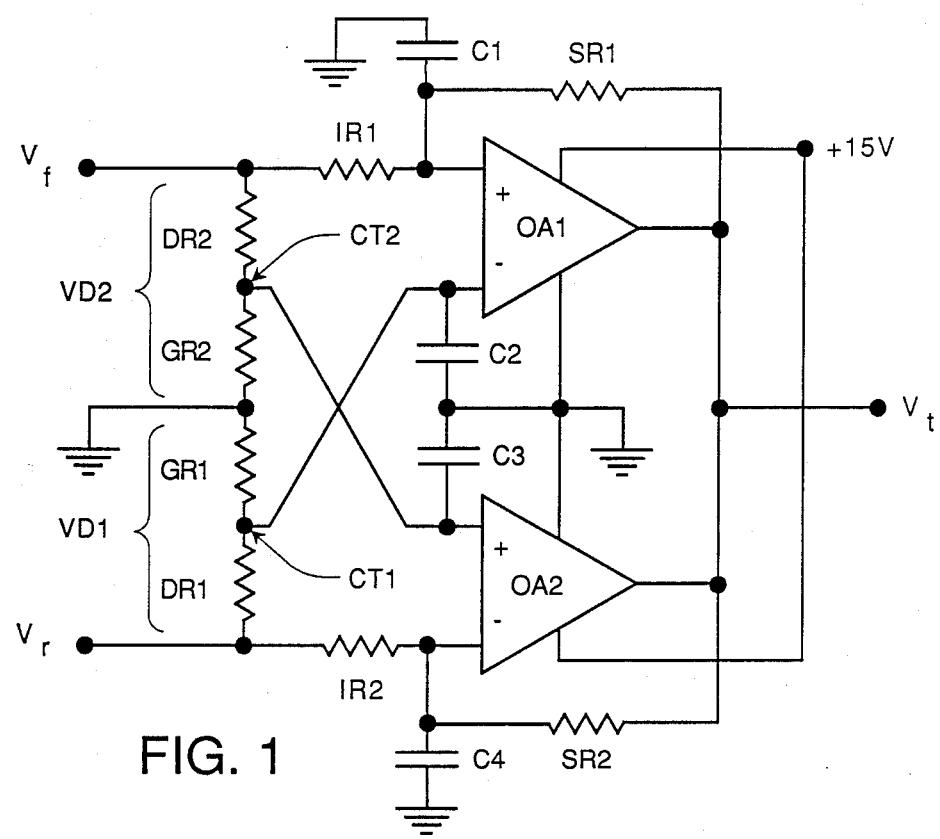
FIG. 1 is electrical schematic of the voltage comparator circuit.

Referring now to FIG. 1, the voltage comparator circuit that is the subject of the present invention compares a fluctuating voltage $V_f$ to a stable reference voltage $V_r$. Fluctuating voltage $V_f$ is fed through first input resistor IR1 to the noninverting input of first op amp OA1; reference voltage $V_r$ is fed through second input resistor IR2 to the inverting input of second op amp OA2. The inverting input of first op amp OA1 is taken from first center tap CT1 of first voltage divider VD1. First center tap CT1 is connected to reference voltage $V_r$ via first direct-connect resistor DR1, and to ground via first grounding resistor GR1. The non-inverting input of second op amp OA21 is taken from second center tap CT2 of second voltage divider VD2. Second center tap CT2 is connected to fluctuating voltage $V_f$ via second direct-connect resistor DR2, and to ground via second grounding resistor GR2. The power inputs of both op amps are connected to a positive voltage and ground. The output of first op amp OA1 is tied to the output of second op amp OA2, with a first feedback loop feeding the tied output voltage $V_t$ to the non-inverting input of first op amp OA1 via a first high-resistance gain-setting resistor SR1, and a second feedback loop feeding the tied output voltage $V_t$ to the inverting input of the second op amp OA2 via a second high-resistance gain-setting resistor SR2.

As long as fluctuating voltage $V_f$ remains within the present range determined by the ratios of DR1 to GR1 and DR2 to GR2, the tied output from op amps OA1 and OA2 will remain high. However, when fluctuating voltage $V_f$ drifts outside the preset range, the tied output will go low. The low voltage signal can be employed to trigger an alarm or a switch that will shut down the process until process parameter corrections are implemented.

Capacitors C1, C2, C3 and C4 are employed to mitigate the effects of noise on the circuit. The higher their capacitance, the slower the circuit's reaction to a deviation from the preset range of acceptable values for $V_f$.

Constructing the circuit which constituted the present invention is relatively simple. By using an off-the-shelf IC chip such as the LM393, both first op amp OA1 and the second op amp OA2 can be combined in a single package. The power inputs of each op amp are connected to +15 volts and ground. For a reference voltage $V_r$ value of 5.00 volts, where fluctuating voltage $V_f$ is to be allowed to fluctuate within a range of approximately plus or minus 2 percent, the following resistor values satisfy this condition:

IR1 and IR2, 1K ohms each;
DR1 and DR2, 1.8K ohms each;
GR1 and GR2, 91K ohms each; and
SR1 and SR2, 10M ohms each.

Figure 2:
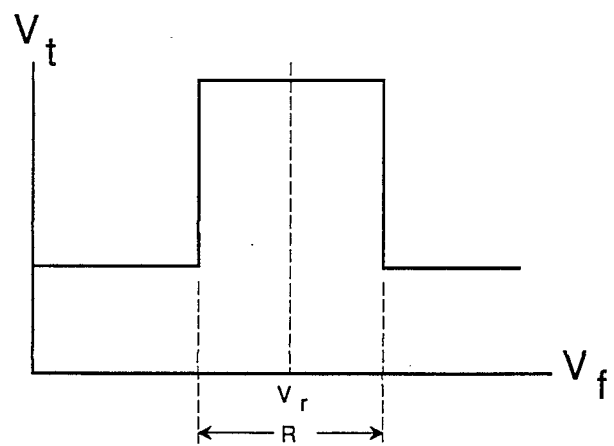
FIG. 2 is a graph of tied output voltage as a function of a fluctuating input voltage.

Referring now to the graph of FIG. 2, the tied output voltage $V_t$ is plotted as a function of fluctuating voltage $V_f$. As long as fluctuating voltage $V_f$ remains within preset range R, the tied output voltage $V_t$ will remain high. However, when fluctuating voltage $V_f$ drifts outside the preset range, the tied output $V_t$ will go low. The low voltage signal can be employed to trigger an alarm or a switch that will shut down the process until process parameter corrections are implemented.

Although only the preferred embodiment of the invention has been described herein, it will be apparent to one skilled in the art that changes and modifications may be made thereto without departing from the spirit and the scope of the invention as claimed.

I claim:

1. A voltage comparator circuit for comparing a fluctuating voltage with a stable reference voltage comprising:
   (a) a first operational amplifier (op amp), the non-inverting input of which is connected to said fluctuating voltage via a first input resistor,
   (b) a second op amp, the inverting input of which is connected to said reference voltage via a second input resistor, and the output of which is tied to the output of said first op amp;
   (c) a first voltage divider having a first center tap which is connected to the inverting input of said first op amp, to ground through a first grounding resistor, and to said reference voltage through a first direct connect resistor;
   (d) a second voltage divider having a second center tap which is connected to the non-inverting input of said second op amp, to ground through a second grounding resistor, and to said fluctuating voltage through a second direct connect resistor;
   (e) a first feed-back loop which routes current from the tied output of both op amps to the non-inverting input of said first op amp via a first gain-setting resistor; and
   (f) a second feed-back loop which routes current from the tied output of both op amps to the inverting input of said second op amp via a second gain-setting resistor.

2. The voltage comparator circuit of claim 1 wherein both the non-inverting input and the inverting input of each op amp are connected to ground through individual noise-suppression capacitors.

3. The voltage comparator circuit of claim 2 wherein the power inputs of said first op amp and of said second op amp are connected to a positive supply voltage and to ground.

4. The voltage comparator of claim 3 wherein the ratio of said first direct-connect resistor to said first grounding resistor is essentially identical to the ratio of said second direct-connect resistor to said second grounding resistor.

5. The voltage comparator circuit of claim 4 wherein said first op amp and said second op amp are essentially identical devices.

6. The voltage comparator circuit of claim 5 wherein said first and second input resistors have essentially identical resistance values.

7. The voltage comparator circuit of claim 6 wherein said first and second gain-setting resistors have essentially identical resistance values

* * * * *

UNITED STATES PATENT AND TRADEMARK OFFICE
CERTIFICATE OF CORRECTION

PATENT NO. : 4,916,570
DATED : April 10, 1990
INVENTOR(S) : James L. Dale

It is certified that error appears in the above-indentified patent and that said Letters Patent is hereby corrected as shown below:

Column 2, line 11, delete "alram" and insert -- alarm --.

Signed and Sealed this

Fourth Day of January, 1994

Attest:

BRUCE LEHMAN

Attesting Officer     Commissioner of Patents and Trademarks